United States Patent
Zeng

(10) Patent No.: US 10,504,415 B2
(45) Date of Patent: Dec. 10, 2019

(54) GOA CIRCUIT AND DRIVING METHOD FOR FOLDABLE DISPLAY PANEL, AND FOLDABLE DISPLAY PANEL

(71) Applicant: Wuhan China Star Optoelectronics Semiconductor Display Technology Co., Ltd., Wuhan, Hubei (CN)

(72) Inventor: Mian Zeng, Hubei (CN)

(73) Assignee: WUHAN CHINA STAR OPTOELECTORNICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 31 days.

(21) Appl. No.: 16/007,790

(22) Filed: Jun. 13, 2018

(65) Prior Publication Data

US 2019/0228697 A1    Jul. 25, 2019

Related U.S. Application Data

(63) Continuation of application No. PCT/CN2018/076312, filed on Feb. 11, 2018.

(30) Foreign Application Priority Data

Jan. 19, 2018  (CN) .......................... 2018 1 0053258

(51) Int. Cl.
  *G09G 3/20*      (2006.01)
  *H01L 27/12*     (2006.01)
(52) U.S. Cl.
  CPC ... *G09G 3/2092* (2013.01); *G09G 2310/0221* (2013.01); *G09G 2310/062* (2013.01); *H01L 27/1218* (2013.01)

(58) Field of Classification Search
  CPC ..................... G09G 3/2092; G09G 2310/0221
  USPC ......................................................... 345/211
  See application file for complete search history.

(56) References Cited

U.S. PATENT DOCUMENTS

| | | | | |
|---|---|---|---|---|
| 2015/0316976 | A1* | 11/2015 | Toyotaka | G06F 1/1641 361/679.27 |
| 2016/0132074 | A1* | 5/2016 | Kim | G06F 1/1652 715/769 |
| 2016/0212840 | A1* | 7/2016 | Koo | G09F 9/301 |
| 2016/0358586 | A1* | 12/2016 | Song | G09G 3/20 |
| 2016/0372078 | A1* | 12/2016 | Song | G09G 3/20 |
| 2017/0345365 | A1* | 11/2017 | Li | G09G 3/3225 |

* cited by examiner

*Primary Examiner* — Michael Pervan
(74) *Attorney, Agent, or Firm* — Leong C. Lei

(57) ABSTRACT

The invention provides a GOA circuit and driving method for foldable display panel and a foldable display panel. The GOA circuit comprises a plurality of cascaded GOA units and a switch module, the GOA units in folding area comprising a reset module; the reset module being for controlling GOA units in folding area to shut down pixels; the switch module having two ends connected respectively to last cascaded GOA unit in first active area and first cascaded GOA unit in second active area, for connecting an output end of the last cascaded GOA unit in the first active area to an input end of the first cascaded GOA unit in the second active area during folding, by using the last cascaded GOA unit in the first active area to output a gate control signal to control activation of the first cascaded GOA unit in the second active area.

15 Claims, 2 Drawing Sheets

GOA CIRCUIT AND DRIVING METHOD FOR FOLDABLE DISPLAY PANEL, AND FOLDABLE DISPLAY PANEL

CROSS REFERENCE TO RELATED APPLICATIONS

This application is a continuing application of PCT Patent Application No. PCT/CN2018/076312, entitled "A GOA CIRCUIT AND DRIVING METHOD FOR FOLDABLE DISPLAY PANEL, AND FOLDABLE DISPLAY PANEL", filed on Feb. 11, 2018, which claims priority to Chinese Patent Application No. CN201810053258.6, filed on Jan. 19, 2018, both of which are hereby incorporated in its entireties by reference.

BACKGROUND OF THE INVENTION

1. Field of the Invention

The present invention relates to the field of display, and in particular to the field of a GOA circuit and driving method for foldable display panel, and foldable display panel.

2. The Related Arts

The flexible display panel, with the advantages of bendable, impact-resistant, easy to wear, and so on, is a hot spot for industrial research. However, the flexible display panel may suffer damages to the gate driver on array (GOA) circuit in the folding area during bending and shortens the lifespan of the GOA circuit in the folding area. Moreover, the active area in the folding area may display poorly because of the deformed pixels and resulted color shift, which leads to the degradation of the overall display effect of the flexible display panel, increases the loss of the folding area of the flexible display panel, as well as reduces the entire lifespan of the flexible display panel.

SUMMARY OF THE INVENTION

To solve the above problem, the present invention provides a GOA circuit and driving method for foldable display panel, and a foldable display panel, to reduce the loss of the folding area of the foldable display panel and increase the lifespan of the foldable display panel.

The present invention provides a GOA circuit for foldable display panel, the foldable display panel having a first active area, a second active area, and a folding area located between the first active area and the second active area, the GOA circuit comprising a plurality of cascaded GOA units and a switch module, and the GOA units in the folding area comprising a reset module;

the reset module being for controlling the GOA units in the folding area to shut down pixels in the folding area during folding the foldable display panel;

the switch module having two ends connected respectively to a last cascaded GOA unit in the first active area and a first cascaded GOA unit in the second active area, for connecting an output end of the last cascaded GOA unit in the first active area to an input end of the first cascaded GOA unit in the second active area during folding the foldable display panel, by using the last cascaded GOA unit in the first active area to output a gate control signal to control activation of the first cascaded GOA unit in the second active area;

wherein before folding the foldable display panel, the GOA units are enumerated in an increasing order from the first active area to the second active area.

Preferably, the plurality of cascaded GOA units are divided into two groups of GOA units, with each group of GOA units comprising a plurality of cascaded GOA units;

wherein the two groups of GOA units are disposed respectively at two opposite sides of the foldable display panel, and in each group of GOA units, the last cascaded GOA unit in the first active area is connected through one switch module to the first cascaded GOA unit in the second active area.

Preferably, the reset module pulls down the voltage of gate driving signal outputted by the GOA units on the folding area to shut down the pixels in the folding area during folding the foldable display panel.

Preferably, the reset module of the GOA units in the folding area is connected to receive an enable signal, and the enable signal is at high voltage during folding the foldable display panel to control the reset module to turn on to enable the reset module to control the GOA units in the folding area to shut down all pixels in the folding area.

Preferably, the switch module is a thin film transistor (TFT), with a gate receiving the enable signal, and a source and a drain connected respectively to the output end of the last cascaded GOA unit in the first active area and the input end of the first cascaded GOA unit in the second active area.

Preferably, the reset module receives the enable signal, and the enable signal is at low voltage to shut down the reset module when the foldable display panel is not folded;

the switch module is also for cutting off the connection between the output end of the last cascaded GOA unit in the first active area and the input end of the first cascaded GOA unit in the second active area when the foldable display panel is not folded.

The present invention also provides a foldable display panel, which comprises: a first active area, a second active area, and a folding area located between the first active area and the second active area, the foldable display panel further comprising a GOA circuit;

the GOA circuit comprising a plurality of cascaded GOA units and a switch module, and the GOA units in the folding area comprising a reset module;

the reset module being for controlling the GOA units in the folding area to shut down pixels in the folding area during folding the foldable display panel;

the switch module having two ends connected respectively to a last cascaded GOA unit in the first active area and a first cascaded GOA unit in the second active area, for connecting an output end of the last cascaded GOA unit in the first active area to an input end of the first cascaded GOA unit in the second active area during folding the foldable display panel, by using the last cascaded GOA unit in the first active area to output a gate control signal to control activation of the first cascaded GOA unit in the second active area;

wherein before folding the foldable display panel, the GOA units are enumerated in an increasing order from the first active area to the second active area.

Preferably, the plurality of cascaded GOA units are divided into two groups of GOA units, with each group of GOA units comprising a plurality of cascaded GOA units;

wherein the two groups of GOA units are disposed respectively at two opposite sides of the foldable display panel, and in each group of GOA units, the last cascaded GOA unit in the first active area is connected through one switch module to the first cascaded GOA unit in the second active area.

Preferably, the reset module pulls down the voltage of gate driving signal outputted by the GOA units on the folding area to shut down the pixels in the folding area during folding the foldable display panel.

Preferably, the reset module of the GOA units in the folding area is connected to receive an enable signal, and the enable signal is at high voltage during folding the foldable display panel to control the reset module to turn on to enable the reset module to control the GOA units in the folding area to shut down all pixels in the folding area.

Preferably, the switch module is a thin film transistor (TFT), with a gate receiving the enable signal, and a source and a drain connected respectively to the output end of the last cascaded GOA unit in the first active area and the input end of the first cascaded GOA unit in the second active area.

Preferably, the reset module receives the enable signal, and the enable signal is at low voltage to shut down the reset module when the foldable display panel is not folded;

the switch module is also for cutting off the connection between the output end of the last cascaded GOA unit in the first active area and the input end of the first cascaded GOA unit in the second active area when the foldable display panel is not folded.

The present invention also provides a driving method for foldable display panel, which comprises the steps of:

shutting down pixels in folding area of foldable display panel during folding the foldable display panel;

a last cascaded GOA unit in a first active area of the foldable display panel outputting a gate driving signal to a first GOA unit in a second active area of the foldable display panel to control activation of the first cascaded GOA unit of the second active area.

Preferably, the step of shutting down the pixels in the folding area of foldable display panel comprises:

pulling down voltage of the gate driving signal outputted by the GOA units in the folding area to low voltage to shut down the pixels in the folding area.

Preferably, the driving method further comprises the following steps:

before folding the foldable display panel, turning on the pixels in the folding area;

the last cascaded GOA unit in the first active area outputting the gate driving signal to a first GOA unit in the folding area, a last cascaded GOA unit in the folding area outputting the gate driving signal to the first GOA unit in the second active area.

The embodiments of the present invention provide the following advantages: when folding the foldable display panel, the GOA units in the folding area are controlled by the reset module to shut down the pixels in the folding area of the foldable display panel to avoid loss of the pixels in the folding area, the last cascaded GOA unit in the first active area is connected to the first GOA unit in the second active area, and the last cascaded GOA unit in the first active area outputting the gate driving signal to the first GOA unit in the second active area to turn on the first GOA unit in the second active area. By using the GOA units in the first active area to turn on the pixels in the first active area and using the GOA units in the second active area to turn on the pixels in the second active area, the first and second active areas can display normally during folding the foldable display panel. During folding the foldable display panel, the pixels in the folding areas are shut down to avoid poor display in the folding area to affect the display effect of the display panel, save energy consumption of the display panel and extend the lifespan of the display panel.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects, and are not intended to describe a particular order.

Figure 1:
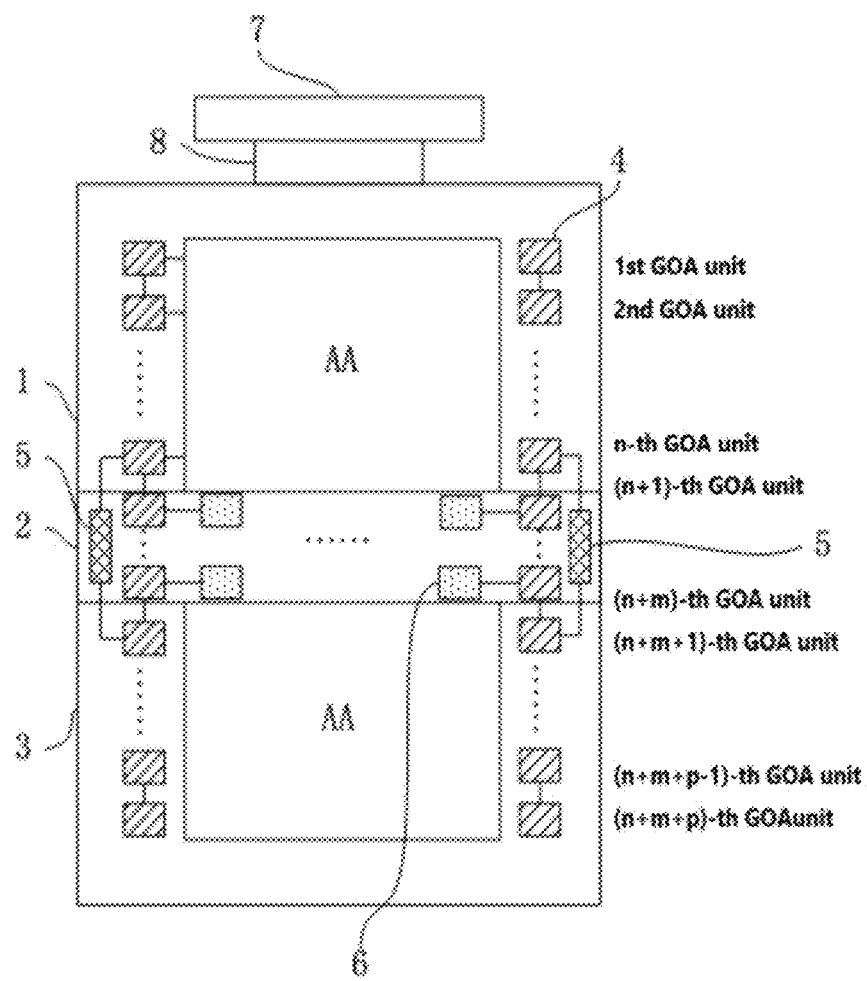
FIG. 1 is a schematic view showing the foldable display panel according to an embodiment of the present invention.
Figure 2:
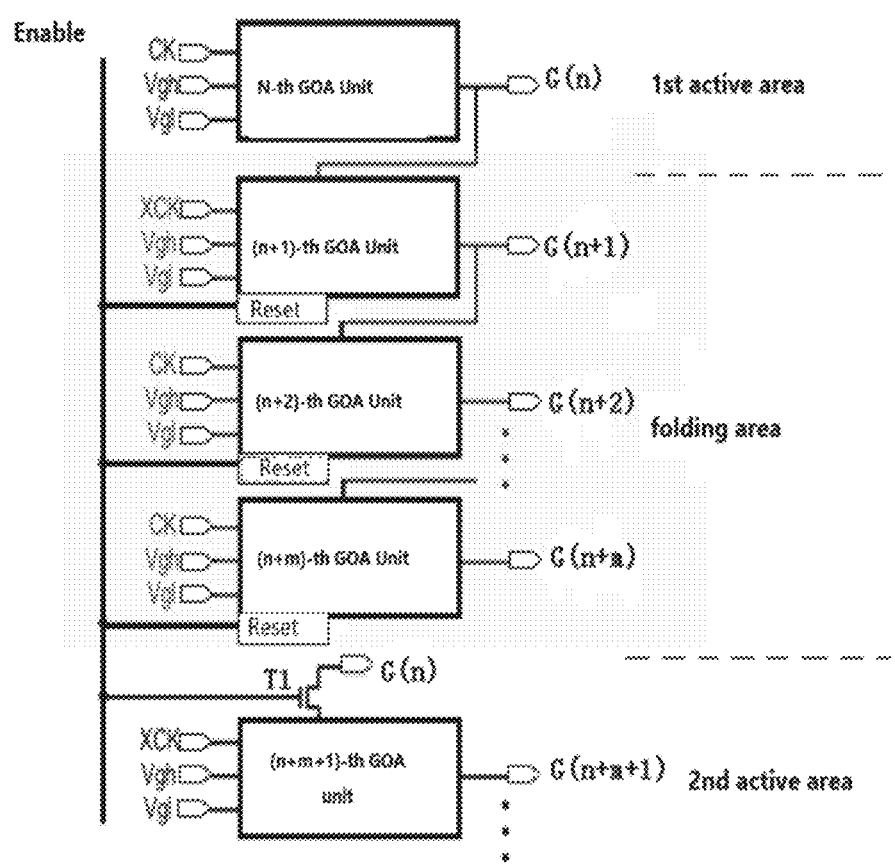
FIG. 2 is a top view showing the driving circuit for foldable display panel according to an embodiment of the present invention.

The present invention provides a GOA circuit for foldable display panel, as shown in FIG. 1. FIG. 1 shows a schematic view of the entire foldable display panel. The foldable display panel comprises: a first active area 1, a second active area 3, and a folding area 2 located between the first active area 1 and the second active area 3. The GOA circuit comprises a plurality of cascaded GOA units 4 and a switch module 5, and as shown in FIG. 2, the GOA units in the folding area 2 comprises a reset module. Each cascaded GOA unit is connected correspondingly to a row of pixels in the display panel.

The reset module is for controlling the GOA units in the folding area 2 to shut down pixels 6 in the folding area 2 during folding the foldable display panel.

The switch module 5 has two ends connected respectively to a last cascaded GOA unit in the first active area 1 and a first cascaded GOA unit in the second active area 3, for connecting an output end of the last cascaded GOA unit in the first active area 1 to an input end of the first cascaded GOA unit in the second active area 3 during folding the foldable display panel, and by using the last cascaded GOA unit in the first active area 1 to output a gate control signal to control activation of the first cascaded GOA unit in the second active area 3.

Wherein before folding the foldable display panel, the GOA units are enumerated in an increasing order from the first active area 1 to the second active area 3.

Moreover, the plurality of cascaded GOA units 4 are divided into two groups of GOA units, with each group of GOA units comprising a plurality of cascaded GOA units.

Wherein the two groups of GOA units are disposed respectively at two opposite sides of the foldable display panel, and in each group of GOA units, the last cascaded GOA unit in the first active area 1 is connected through one switch module to the first cascaded GOA unit in the second active area 3.

As shown in FIG. 1, the GOA units are located at the non-effective active area outside of the effective active areas AA of the foldable display panel. The non-effective active area at the two sides of the foldable display panel is disposed with n+m+p GOA units. Each GOA unit at the two sides corresponds to a row of pixels for turning on the pixels of the row. The GOA units are distributed symmetrically at two sides of the foldable display panel. Take the GOA units at the right side of the effective active area AA of the foldable display panel as example. In the first active area 1, n GOA units are disposed at the right side of the effective active area AA: enumerated as the first GOA unit to the n-th GOA unit; m GOA units are disposed at the right side of the folding area 2: enumerated as the (n+1)-th GOA unit to the (n+m)-th GOA unit; in the second active area 3, p GOA units are disposed at the right side of the effective active area AA: enumerated as the (n+m+1)-th GOA unit to the (n+m+p)-th GOA unit. All these GOA units are cascaded.

Similarly, in the first active area 1, n GOA units are disposed at the left side of the effective active area AA: enumerated as the first GOA unit to the n-th GOA unit; m GOA units are disposed at the left side of the folding area 2: enumerated as the (n+1)-th GOA unit to the (n+m)-th GOA unit; in the second active area 3, p GOA units are disposed at the left side of the effective active area AA: enumerated as the (n+m+1)-th GOA unit to the (n+m+p)-th GOA unit.

It should be noted that the n-th GOA unit at the right and left sides of the display panel are the last cascaded GOA unit in the first active area 1, and the (n+m+1)-th OA unit at the right and left sides of the display panel are the first cascaded GOA unit in the second active area 3; the (n+1)-th OA unit at the right and left sides of the display panel are the first cascaded GOA unit in the folding area 2, and the (n+m)-th OA unit at the right and left sides of the display panel are the last cascaded GOA unit in the folding active area 2.

Obviously, the foldable display panel further comprises a printed circuit board (PCB) 7 for providing control signals and chip on flex (or chip on film, COF) 8.

Moreover, the reset module is for pulling down the voltage of gate driving signal outputted by the GOA units on the folding area 2 to shut down the pixels in the folding area 2 during folding the foldable display panel.

Moreover, the reset module of the GOA units in the folding area 2 is connected to receive an enable signal, and the enable signal is at high voltage during folding the foldable display panel to control the reset module to turn on to enable the reset module to control the GOA units in the folding area to shut down all pixels in the folding area 2.

Moreover, the switch module 5 is a thin film transistor (TFT), with a gate receiving the enable signal, and a source and a drain connected respectively to the output end of the last cascaded GOA unit in the first active area 1 and the input end of the first cascaded GOA unit in the second active area 3.

Moreover, the reset module receives the enable signal, and the enable signal is at low voltage to shut down the reset module when the foldable display panel is not folded; so that the gate driving signal outputted by the GOA units in the folding area 2 is at high voltage to turn on the pixels in the folding area 2.

Moreover, the switch module 5 is also for cutting off the connection between the output end of the last cascaded GOA unit in the first active area 1 and the input end of the first cascaded GOA unit in the second active area 2 when the foldable display panel is not folded.

As shown in FIG. 2, the present invention provides another embodiment. In this embodiment, the n-th GOA unit, the (n+m+1)-th GOA unit and all the GOA units in-between are all connected to receive a clock signal CK, a high voltage signal VGH and a low voltage signal VGL. In two adjacent GOA units, the output end of the previous GOA unit is connected t the input end of the next GOA unit; for example, the (n+1)-th GOA unit receives the gate driving signal G(n) outputted by the n-th GOA unit; the (n+2)-th GOA unit receives the gate driving signal G(n) outputted by the (n+1)-th GOA unit; the (n+m+1)-th GOA unit (i.e., the first GOA unit in the second active area 3) receives the gate driving signal G(n) outputted by the n-th GOA unit;

The aforementioned switch module 5 is a TFT T1, with a gate receiving the enable signal, a source connected to the output end of the n-th GOA unit (i.e., the last GOA unit in the first active area 1), and a drain connected to the input end of the (n+m+1)-th GOA unit. By using the enable signal to control the on-and-off for the TFT T1, the present invention is able to control the connection or cut-off between the n-th GOA unit and the (n+m+1)-th GOA unit.

When folding the foldable display panel, the enable signal is at high voltage to turn on the TFTT1. When the foldable display panel is not folded, the enable signal is at low voltage to turn off the TFT T1. The TFTT1 is an N-channel TFT.

The present invention also provides a driving method for foldable display panel, which comprises the steps of:

shutting down pixels in folding area 2 of foldable display panel during folding the foldable display panel;

a last cascaded GOA unit in a first active area 1 of the foldable display panel outputting a gate driving signal to a first GOA unit in a second active area 3 of the foldable display panel to control activation of the first cascaded GOA unit of the second active area 2.

Moreover, the step of shutting down the pixels in the folding area 2 of foldable display panel specifically comprises:

pulling down voltage of the gate driving signal outputted by the GOA units in the folding area 2 to low voltage to shut down the pixels in the folding area 2.

Moreover, the driving method further comprises the following steps:

before folding the foldable display panel, turning on the pixels in the folding area 2;

the last cascaded GOA unit in the first active area 1 outputting the gate driving signal to a first GOA unit in the folding area 2, a last cascaded GOA unit in the folding area 2 outputting the gate driving signal to the first GOA unit in the second active area 3.

In summary, when folding the foldable display panel, the GOA units in the folding area 2 are controlled by the reset module to shut down the pixels in the folding area 2 of the foldable display panel to avoid loss of the pixels in the folding area 2, the last cascaded GOA unit in the first active area 1 is connected to the first GOA unit in the second active area 3, and the last cascaded GOA unit in the first active area 1 outputting the gate driving signal to the first GOA unit in the second active area 3 to turn on the first GOA unit in the second active area 3. By using the GOA units in the first active area 1 to turn on the pixels in the first active area 1 and using the GOA units in the second active area 3 to turn on the pixels in the second active area 3, the first active area 1 and the second active areas 3 can display normally during folding the foldable display panel. During folding the foldable display panel, the pixels in the folding areas 2 are shut down to avoid poor display in the folding area 2 to affect the display effect of the display panel, save energy consumption of the display panel and extend the lifespan of the display panel.

When the display panel is not folded, the reset module stops operation, and the GOA units in the folding area 2 can turn on the pixels in the folding area 2 normally, and the GOA units in the folding area 2 can also participate in output signal propagation normally. As such, the folding area 2 can also display normally as the first active area 1 and the second active area 3.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A gate driver on array (GOA) circuit for foldable display panel, the foldable display panel having a first active area, a second active area, and a folding area located between the first active area and the second active area, the GOA circuit comprising a plurality of cascaded GOA units and a switch module, and the GOA units in the folding area comprising a reset module;
   the reset module being for controlling the GOA units in the folding area to shut down pixels in the folding area during folding the foldable display panel;
   the switch module having two ends connected respectively to a last cascaded GOA unit in the first active area and a first cascaded GOA unit in the second active area, for connecting an output end of the last cascaded GOA unit in the first active area to an input end of the first cascaded GOA unit in the second active area during folding the foldable display panel, by using the last cascaded GOA unit in the first active area to output a gate control signal to control activation of the first cascaded GOA unit in the second active area;
   wherein before folding the foldable display panel, the GOA units are enumerated in an increasing order from the first active area to the second active area.

2. The GOA circuit for foldable display panel as claimed in claim 1, wherein the plurality of cascaded GOA units are divided into two groups of GOA units, with each group of GOA units comprising a plurality of cascaded GOA units;
   wherein the two groups of GOA units are disposed respectively at two opposite sides of the foldable display panel, and in each group of GOA units, the last cascaded GOA unit in the first active area is connected through one switch module to the first cascaded GOA unit in the second active area.

3. The GOA circuit for foldable display panel as claimed in claim 1, wherein the reset module pulls down the voltage of gate driving signal outputted by the GOA units on the folding area to shut down the pixels in the folding area during folding the foldable display panel.

4. The GOA circuit for foldable display panel as claimed in claim 1, wherein the reset module of the GOA units in the folding area is connected to receive an enable signal, and the enable signal is at high voltage during folding the foldable display panel to control the reset module to turn on to enable the reset module to control the GOA units in the folding area to shut down all pixels in the folding area.

5. The GOA circuit for foldable display panel as claimed in claim 1, wherein the switch module is a thin film transistor (TFT), with a gate receiving the enable signal, and a source and a drain connected respectively to the output end of the last cascaded GOA unit in the first active area and the input end of the first cascaded GOA unit in the second active area.

6. The GOA circuit for foldable display panel as claimed in claim 1, wherein the reset module receives the enable signal, and the enable signal is at low voltage to shut down the reset module when the foldable display panel is not folded;
   the switch module is also for cutting off the connection between the output end of the last cascaded GOA unit in the first active area and the input end of the first cascaded GOA unit in the second active area when the foldable display panel is not folded.

7. A foldable display panel, comprising: a first active area, a second active area, and a folding area located between the first active area and the second active area, the foldable display panel further comprising a GOA circuit;
   the GOA circuit comprising a plurality of cascaded GOA units and a switch module, and the GOA units in the folding area comprising a reset module;
   the reset module being for controlling the GOA units in the folding area to shut down pixels in the folding area during folding the foldable display panel;
   the switch module having two ends connected respectively to a last cascaded GOA unit in the first active area and a first cascaded GOA unit in the second active area, for connecting an output end of the last cascaded GOA unit in the first active area to an input end of the first cascaded GOA unit in the second active area during folding the foldable display panel, by using the last cascaded GOA unit in the first active area to output a gate control signal to control activation of the first cascaded GOA unit in the second active area;
   wherein before folding the foldable display panel, the GOA units are enumerated in an increasing order from the first active area to the second active area.

8. The foldable display panel as claimed in claim 7, wherein the plurality of cascaded GOA units are divided into two groups of GOA units, with each group of GOA units comprising a plurality of cascaded GOA units;
   wherein the two groups of GOA units are disposed respectively at two opposite sides of the foldable display panel, and in each group of GOA units, the last cascaded GOA unit in the first active area is connected through one switch module to the first cascaded GOA unit in the second active area.

9. The foldable display panel as claimed in claim 7, wherein the reset module pulls down the voltage of gate driving signal outputted by the GOA units on the folding area to shut down the pixels in the folding area during folding the foldable display panel.

10. The foldable display panel as claimed in claim 7, wherein the reset module of the GOA units in the folding area is connected to receive an enable signal, and the enable signal is at high voltage during folding the foldable display panel to control the reset module to turn on to enable the reset module to control the GOA units in the folding area to shut down all pixels in the folding area.

11. The foldable display panel as claimed in claim 7, wherein the switch module is a thin film transistor (TFT), with a gate receiving the enable signal, and a source and a drain connected respectively to the output end of the last cascaded GOA unit in the first active area and the input end of the first cascaded GOA unit in the second active area.

12. The foldable display panel as claimed in claim 7, wherein the reset module receives the enable signal, and the enable signal is at low voltage to shut down the reset module when the foldable display panel is not folded;
the switch module is also for cutting off the connection between the output end of the last cascaded GOA unit in the first active area and the input end of the first cascaded GOA unit in the second active area when the foldable display panel is not folded.

13. A driving method for foldable display panel, comprising the steps of:
shutting down pixels in folding area of foldable display panel during folding the foldable display panel;
a last cascaded GOA unit in a first active area of the foldable display panel outputting a gate driving signal to a first GOA unit in a second active area of the foldable display panel to control activation of the first cascaded GOA unit of the second active area.

14. The driving method for foldable display panel as claimed in claim 13, wherein the step of shutting down the pixels in the folding area of foldable display panel specifically comprises:
pulling down voltage of the gate driving signal outputted by the GOA units in the folding area to low voltage to shut down the pixels in the folding area.

15. The driving method for foldable display panel as claimed in claim 13, wherein the driving method further comprises the following steps:
before folding the foldable display panel, turning on the pixels in the folding area;
the last cascaded GOA unit in the first active area outputting the gate driving signal to a first GOA unit in the folding area, a last cascaded GOA unit in the folding area outputting the gate driving signal to the first GOA unit in the second active area.

* * * * *